(12) United States Patent
Uhlemann

(10) Patent No.: US 7,745,783 B2
(45) Date of Patent: Jun. 29, 2010

(54) MONOCHROMATOR AND RADIATION SOURCE WITH MONOCHROMATOR

(75) Inventor: Stephan Uhlemann, Heidelberg (DE)

(73) Assignee: CEOS Corrected Electron Optical Systems GmbH, Heidelberg (DE)

( * ) Notice: Subject to any disclaimer, the term of this patent is extended or adjusted under 35 U.S.C. 154(b) by 176 days.

(21) Appl. No.: 12/153,455

(22) Filed: May 20, 2008

(65) Prior Publication Data

US 2008/0290273 A1    Nov. 27, 2008

(30) Foreign Application Priority Data

May 24, 2007  (DE) .................. 10 2007 024 353

(51) Int. Cl.
  *G21K 1/06*  (2006.01)
  *G21K 5/02*  (2006.01)
(52) U.S. Cl. ............. 250/305; 250/396 R; 250/396 ML
(58) Field of Classification Search .................. 250/305, 250/306, 307, 308, 309, 310, 311, 396 R, 250/397, 396 ML, 492.1, 492.2, 492.21, 250/492.3
See application file for complete search history.

(56) References Cited

U.S. PATENT DOCUMENTS

| | | | | |
|---|---|---|---|---|
| 5,126,565 | A | * | 6/1992 | Rose ........................... 250/305 |
| 6,097,028 | A | * | 8/2000 | Tsuno ......................... 250/305 |
| 6,770,878 | B2 | | 8/2004 | Uhlemann |
| 7,126,117 | B2 | | 10/2006 | Grzelakowski |
| 7,250,599 | B2 | | 7/2007 | Funnemann |
| 2002/0104966 | A1 | * | 8/2002 | Plies et al. .................. 250/311 |
| 2003/0098414 | A1 | * | 5/2003 | Uhlemann et al. ......... 250/305 |

FOREIGN PATENT DOCUMENTS

| | | |
|---|---|---|
| DE | 196 33 496 | 2/1998 |
| EP | 0 470 299 | 2/1992 |

OTHER PUBLICATIONS

Kahl, Frank "Design eines Monochromators fuer Elektronenquellen". TU Darmstadt, Fachbereich Physik, 1999.

* cited by examiner

*Primary Examiner*—Jack I Berman
*Assistant Examiner*—Nicole Ippolito Rausch
(74) *Attorney, Agent, or Firm*—Paul Vincent

(57) ABSTRACT

A monochromator (1) for a charged particle optics, in particular, for electron microscopy, comprises at least one first deflection element (2, 3) with an electrostatic deflecting field (2', 3') for generating a dispersion (4) in the plane (5) of a selection aperture (6) to select charged particles of a desired energy interval (7) and at least one second deflection element (8, 9) with an electrostatic deflecting field (8', 9') which eliminates the dispersion (4) of the at least one first deflecting field (2', 3'). A radiation source (17) comprises such a monochromator (1). High monchromatism without intensity contrasts caused by defects of the slit aperture is thereby achieved in that the deflection elements (2, 3, 8, 9) have a design other than spherically shaped and their electrodes (24, 25) are given a potential ($\phi_+$, $\phi_-$) such that the charged particles ($x_\alpha$, $y_\beta$) which virtually enter the image of the radiation source (17) at different respective angles ($\alpha$, $\beta$) in different sections (x, y), are differently focused such that charged particles ($x_\alpha$, $y_\beta$) of one energy are point focused (10, 10', 10") exclusively in the plane (5) of the selection aperture (6), since zero-crossings (11, 12) of the deflections (A) of the charged particles ($x_\alpha$, $y_\beta$) of the different sections (x, y) only coincide there at the same axial position (z, E).

21 Claims, 9 Drawing Sheets

MONOCHROMATOR AND RADIATION SOURCE WITH MONOCHROMATOR

This application claims Paris Convention priority to DE 10 2007 024 353.9 filed on May 24, 2007 the entire disclosure of which is hereby incorporated by reference.

BACKGROUND OF THE INVENTION

The invention concerns a monochromator for a charged particle optics, in particular, for electron microscopy, comprising at least one first deflection element with an electrostatic deflecting field for generating a dispersion in the plane of a selection aperture for selecting the charged particles of the desired energy interval and at least one second deflection element with an electrostatic deflecting field which eliminates the dispersion of the at least one first deflecting field.

Chromatic aberration is one of the main factors that limits the resolution in the charged particle optics due to the resulting broadening of the charged particle beam due to the width of the energy spectrum and the chromatic aberration of the lenses. The monochromators are used to limit this chromatic aberration. In electron microscopy e.g., the energy width of 0.2 eV must not be exceeded with an acceleration voltage of 200 kV, in order to obtain a resolution of less than 1 Angstrom. Electron sources with the smallest full width at half maximum are thermally supported field emission cathodes, having an energy full width at half maximum of still 0.6 to 1.0 eV. Investigations have shown that approximately 30% of the electrons deviate by less than 0.1 eV. For certain applications, such as transmission or scanning electron microscopes, small beam currents are sufficient, such that it is possible to filter out approximately 70% of the electrons in order to realize a sufficiently monochromatic electron source with sufficient beam currents. Monochromators can therefore be used.

EP 0 470 299 B1 discloses a monochromator, in which hemispherical capacitors with inner and outer hemispherical electrodes are used as deflection elements, which are connected to different potentials. The deflection elements are arranged mirror-symmetrically with respect to a center plane that contains a selection aperture for selecting out electrons of different energy. Since the deflection elements are designed as hemispherical capacitors, the charged particles which are deflected in different directions with respect to the optical axis, are repeatedly focused to points, since the charged particles are deflected in a spherical field which equally influences the charged particles of all sections through the optical path, such that the generated intermediate images of the radiation source are point-like. Two of these point focusings are thereby formed upstream and downstream of the selection aperture, and one point focusing is formed in the opening of the selection aperture.

With point focusing of this type, only the charged particles of the same energy meet at one point. Due to the different energies of the charged particles, the points of the charged particles of different energies are joined and form one line, which enables shielding of the charged particles with an excessive high or low energy by means of the selection aperture, and permits passage only of the charged particles of the desired energy interval. This energy interval is then reunited downstream of the selection aperture by the downstream deflection elements. The dispersion of the upstream deflection elements is thus again eliminated.

One disadvantage of a monochromator of this construction is that the interaction of the charged particles increases the closer they are brought together. This Boersch effect counteracts the desire to obtain a high monochromatism. The charged particles deflect each other, which causes deceleration and acceleration with an additional dispersion effect, which results in an increase of the virtual source size. A monochromator is constructed in such a fashion that it eliminates the dispersion of the part upstream of the selection aperture in the part downstream of the selection aperture. It can thereby reverse the displacements caused by its deflecting fields, but not those displacements caused by the interaction of the charged particles, which influences the monchromatism and thereby the ability of focusing the beam, which again impairs the resolution of the optics.

In view of the above and similar monochromators with point focusing (stigmatic intermediate images), a monochromator of the above-mentioned type was proposed in the dissertation "Design of a monochromator for electron sources" by Frank Kahl (internet: elib.tudarmstadt.de/diss/000030), in which the deflection elements are designed in such a fashion that the charged particles of an x and a y-section describe different paths and only astigmatic intermediate images are produced in the form of line focuses. The proposed monochromator has been patented (DE 196 33 496B4).

This dissertation presents the previous monochromators in section 3.1 thereof (pages 25 to 27), i.a. the monochromator by Rose (3.1.3) which corresponds to EP 0 470 299 B1. In 10.2.3 (pages 144 to 148), the stigmatic and astigmatic optical paths are compared to determine that stigmatic intermediate images (point focuses) produce a multiple source enlargement compared to astigmatic intermediate images (line focuses).

In view of the latter, an enlargement of the source area by a factor of 7 was stated as the "worst case", the system of Rose, however, states as a "worst case" an enlargement of the source area by a factor of 60 (loc. cit. p. 148).

Since all previous monochromators show the disadvantageous Boersch effect of point focuses (stigmatic intermediate images), the beam current had to be limited to 10 nA (loc. cit. p. 28). This is again disadvantageous, since an increase in resolution requires large illumination currents in connection with a small source energy width. In order to overcome this limitation, it was proposed to allow for astigmatic real intermediate images of the source only (loc. cit. 3.2, page 28), i.e. line focuses. Line focus means that the charged particles of a given energy in the intermediate images of the radiation source are not focused into a point but a line. This line is broadened by the different energies due to dispersion, such that a beam is produced in the focal plane, which has a substantially rectangular cross-section. In order to select a desired energy interval with this focus, the charged particles with differing energies must be selected out and only the line focuses of the desired energy interval are allowed to pass through the aperture. The line focuses require a slit aperture oriented in their direction, whose width determines the selected energy interval (FIG. 8).

This monochromator does avoid the strong Boersch effect of stigmatic intermediate images, but the disadvantage of this monochromator is that unevenness or soiling of the aperture slit also effects the charged particle beam, resulting in scattering and intensity modulations in the final image of the optical system which show up as stripes across the image (FIGS. 8a and 8b). The sensitivity in this regard is sufficiently large that this fault cannot be prevented by mechanical precision and prevention of dirt deposit. In particular, for objects with small intensity contrast such as thin crystals, this causes the intensity contrasts of the object to be superimposed by the intensity contrasts of this defect, which produces stripes in the image that often prevent image evaluation.

It is therefore the underlying purpose of the invention to design a monochromator of the above-mentioned type in such a fashion that a high monchromatism can be achieved without intensity contrasts caused by defects of the aperture.

SUMMARY OF THE INVENTION

This goal is achieved in accordance with the invention in that the deflection elements are not designed with spherical form and a potential is applied to the electrodes such that the charged particles which virtually enter the image of the radiation source at respective angles in different sections, are differently focused, and charged particles of one energy are point-focused exclusively in the plane of the selection aperture, since zero crossings of the deflections of the charged particles of the different sections only coincide at the same axial position at that location.

As described above in connection with EP 0 470 299 B1, point focusing and dispersion in the area of the selection aperture are also utilized in this invention to permit only electrons of the desired energy interval to pass through the selection aperture (see FIGS. 7 and 7a) Subsequently the dispersion produced in the part of the monochromator upstream of the selection aperture is eliminated again in the downstream part of the monochromator. This dispersion can be eliminated in two different ways: either by uniting the charged particles at one point, which are eliminated only at this point, or by complete unification, i.e. by producing synchronism. The latter is preferably effected in that the forces of the downstream part of the monochromator correspond to the forces of the upstream part, but have opposite directions.

The invention is based on the fundamental idea to prevent the above-mentioned scattering of charged particles by the slit aperture and also to minimize impairment of monchromatism by the Boersch effect. In order not to use a slit aperture, the different energies must be point-focused in the area of the selection aperture, such that the desired energy interval can be separated from the differing energies using an aperture. Since the charged particle current through the point focus only shows minimum expansion in the area where the differing energies are cut out, the unevenness and soiling of the edge of the aperture opening used can be neglected. However, further point focusings had to be prevented in order to limit the Boersch effect of point focusing to the single point focusing in the area of the selection aperture. For this reason, it is not possible to use spherical fields as proposed by EP 047 0299 B1, which considerably increase the source area (loc. cit. p. 148) with five stigmatic intermediate images (loc. cit. p. 26).

As proposed by Kahl (loc. cit.), the deflection elements must be designed, such that charged particles located at a distance from the optical axis in different directions, i.e. located in different sections, e.g. x-section or y-section, must be differently deflected. In this way, further point focusings outside of the area of the selection aperture can be prevented in that the deflections of the charged particles that are disposed in different sections do not have zero-crossings at the same time. On the other hand, the deflection elements must be designed and given a potential such that the zero crossings of the charged particles of all possible sections coincide in the plane of the selection aperture. It is thereby possible to maintain the advantages of selection of the undesired energies in one point focus without causing a strong increase of the source area by further point focuses (stigmatic intermediate images). This provides large illumination currents in connection with a small energy width of the source and thereby considerably increases the resolution.

The geometries and potentials of the deflection elements for obtaining the deflection paths with one single point focus in the plane of the selection aperture can be obtained in the most different ways. Since there is practically an infinite number of geometries and potentials with this effect, the expert must attain his/her desired solution from a plurality of possibilities. This is achieved on the one hand by determining certain parameters, which are suitable in general or for the specific particle optics, e.g. the specific electron microscope, which may be followed by a calculation, which determines the specific form. Such calculations are disclosed e.g. in the above-mentioned dissertation by Kahl (loc. cit.).

It is naturally favorable to also initially minimize the number of line focuses, since they also have a Boersch effect which is, however, considerably smaller than with a point focus.

It could therefore be suitable to design the fields in such a fashion that there are no further focuses in the monochromator except for the zero-crossings of the deflections of the charged particles of different sections in the plane of the selection aperture. On the other hand, one also aims to obtain a widely expanded dispersion in the selection aperture, which requires certain path curvatures and can possibly only be realized when at least two line focuses are allowed in one section.

In this case, the advantages and disadvantages for the specific optics must be evaluated under the condition that the deflection elements must be designed in such a fashion that the zero-crossings of the amplitudes of charged particles of different sections meet exclusively in the area of the selection aperture. In a suitable design, the deflection elements are designed such that the deflecting fields cause reversal points in the deflection of the charged particles of a section (x direction) with intermediate zero-crossings through the axis of the deflection path, however, for charged particles of a section oriented perpendicularly thereto (y direction), the path curvatures change only with one single zero-crossing through the optical axis in the area of the selection aperture. If zero-crossings occur only in the x or y direction, only line focusings are produced which have a considerably smaller Boersch effect.

The fact that the charged particles of the sections are described in the x and y directions, naturally only helps to describe the deformation of the beam bundle through the electrical fields. In fact, the overall beam cross-section of the x-y plane is filled with charged particles which all take part in the deformation of the beam cross-section, such that the overall beam including the charged particles, wherein $\alpha$ and $\beta$ are between zero and a maximum value, is bundled in the line focus into a line in the x or y direction, and into a point at the point focus. The particle beam therefore alternately forms lines except for in the selection aperture (point focus)—in as far as line focuses are permitted—which extend in the x or y direction, and forms intermediate ellipses which extend in their longitudinal direction alternately in one or the other direction, with transition circles in between. The line focuses are then zero-crossings of the charged particles of the x or y section and there are zero-crossings for all sections in the point focus.

The monochromator according to the invention is advantageous both for scanning electron microscopes and also for conventional image electron microscopes. The scanning function can be improved, since monchromatism can yield a smaller spot (image point). For conventional imaging, the intensity contrasts of the slit aperture limiting a line focus (see above, reference to DE 196 33 496 B4) having a striped structure of the light intensity of the image can be avoided.

The invention is therefore particularly suited for electron microscopes, which have both raster imaging and also conventional imaging.

Deflection elements with surfaces that are curved in one or two dimensions are provided for generating the deflecting fields. These include curved paths which have a positive voltage on the inner side and a negative voltage on the outer side with respect to the axial potential, if the charged particles are electrons or are negatively charged ions, in order to guide the charged particles on this path. In order to differently influence the charged particles of different sections, fields must be generated which differ from the field of spheres. Electrodes with deflecting fields are used for this purpose which are asymmetrical relative to the deflection path, i.e. have different strengths in the x and y directions. The relationships with respect to the x section, in which contains the curved optical axis are symmetrical with respect to geometry and potential curves, such that the path remains in this symmetry plane.

In order to come to a certain solution, the expert may proceed e.g. as described by Kahl (loc. cit.), however, of course with the restriction that a stigmatic intermediate image of the source (point focus) must be in the selection aperture. The basis of the calculation must be correspondingly changed.

The basic method of the expert is briefly outlined herein with reference to Kahl (loc. cit.). The expert must initially select the shape of the axis E of the monochromator. He/she selects e.g. the $\Omega$ shape to obtain a straight optical axis of the charged particle optics, e.g. of the electron microscope except for the interruption by the monochromator. When $\Omega$ is relatively steep, such that the input and output are close together, he/she will obtain a small height, which is also desired. The expert will select the same voltages for the electrodes of the deflection elements, since this increases the operational stability, since the voltages of the deflection elements cannot fluctuate with respect to each other. The expert will moreover select maximum dispersion at the point focus in order to exactly select the desired energy.

As a first step, the curvatures of the optical axis will be selected on these premises, e.g. the a form or, for the above-mentioned reasons, the $\Omega$ form. The curvature of the axis is thereby determined only by the electric dipoles of the electrodes of the deflection elements. The fundamental paths of the charged particles are calculated in an orthogonal coordinate system with a z-axis, which corresponds to the axis E of the monochromator, i.e. is curved. The deflection elements are inserted into this coordinate system, which are designed as sections of toroids, so that these shapes can be used as the basis for an approximative calculation. This is a calculation according to the SCOFF approximation (Sharp-Cut-Off Fringe Field approximation) for calculating the exact geometry as disclosed by Kahl (loc. cit.) chapter 5, page 57 ff. This is based on a fundamental path calculation (loc. cit. 4.4.2, p. 44 ff.), which contains the present conditions for the focuses. The electrode surfaces are specifically designed to extend symmetrically to the xz section in the orthogonal coordinate system. In any case, the surfaces of the toroids have the same distance from any location on the z-axis, such that the toroid is provided as a geometrical figure for the calculation of the SCOFF approximation. A toroid thereby means a circular ring shape of any cross-section of the type claimed. The surfaces between which the deflection path extends, preferably do not form cylinder surfaces in the y direction. It is thereby possible to superpose multipoles on the dipoles, since the respective potential is increased when the electrode comes geometrically closer to the optical axis at a location in the x-z plane, and is reversely reduced when it is further away. The reason therefore is that this deflecting field design counteracts the aperture aberrations caused by the monochromator. The multipoles may be quadrupoles, hexapoles or higher-order multipoles, wherein the latter are also used to minimize aperture aberrations of third or higher order. With respect to the calculation of the electrode form, reference is made to Kahl (loc. cit. 5.3, p. 61 ff; 8.5, p. 94 ff. and p. 125, 126).

The calculation of the specific form including taking into consideration the edge areas of the deflection paths limited to a toroidal shape by the electrodes for the formation of the deflecting fields is performed through triangulation (loc. cit. 9.1, p. 99 ff) and an iteration method (Kahl, loc. cit. 9.3.9.4 and 9.5, p. 108 ff).

The following table shows a selection of preferred parameters for a system, wherein the dipole fields are superposed by quadrupole fields:

| Parameter | unit | Preferred selection |
|---|---|---|
| Deflection angle of each deflector ($\theta$) | deg | 120 . . . 150 |
| $R_2/R$ | 1 | 1.4 . . . 1.8 |
| Quadrupole in the first deflector $\Phi_2 \cdot \dfrac{R_2}{U}$ | 1 | 0.08 . . . 0.3 |
| Quadrupole in the second deflector $\Phi_2 \cdot \dfrac{R_2}{U}$ | 1 | 0.2 . . . 0.4 |
| Separation between the first and the second deflector | R | 0.05 . . . 0.4 |
| Separation between the second deflector and the selection aperture | R | 0.05 . . . 0.5 |
| Position of the virtual image after entry | R | 1.5 . . . 2.5 |
| Virtual separation between aperture and entry | R | 2 . . . 20 | wherein:

$R_1 = R = \dfrac{2U}{\Phi_1}$ radius if curvature of the first deflection element R states that the lengths are measured in units of the radius of curvature of the first deflection element.
$R_2$ radius of curvature of the second deflector
$\Phi_1$ the field strength of the dipole field
$\Phi_2$ the field strength of the quadrupole field
U the potential difference between the cathode and the axis - preferably constant within the overall monochromator.

The paths can be precisely influenced through selection of the strength of the field components $\Phi_1$ (dipole) and $\Phi_2$ (quadrupole), the arc radii and arc angles of the deflection elements and thereby the arc length of the deflection elements and the field-free spaces. One achieves a total number of degrees of freedom of the monochromator, which are counterbalanced with requirements e.g. where focuses shall be produced and that the system shall finally be dispersion-free. When the dipole and quadrupole strengths of one deflector are selected to be approximately constant, one obtains approximately the degrees of freedom as mentioned in the above table. The field components $\Phi_1$ and $\Phi_2$ (and possibly further selected components) produce the electrode surfaces of the deflection elements by determining the surfaces $\phi$=const in correspondence with equation (5.4), p. 61 Diss. Kahl (loc. cit.) on both sides of the axis for $\phi_+>U$ and $\phi_-<U$. These electrostatic potentials $\phi_+$ and $\phi_-$ must then be brought to the metallic deflection elements.

For compensation of an aperture aberration of second order with a hexapole, a further field component $\Phi_3$ must be included in the calculation.

The surfaces of the electrodes found according to the above-mentioned method may be surfaces of different shapes. The only precondition is that they are not spherical surfaces, since these always generate several point focusings. For surfaces that are sufficiently different from a spherical symmetry, line focuses are generated. The surfaces are preferably curved in the y direction but are mirror-symmetrical to the xz plane. The electrodes of the deflection elements are thereby suitably shaped, such that they limit the deflection paths by surfaces, which are sections from a truncated conical lateral surface. These surfaces may form two "V"s whose tips point in the same direction. The deflection path extends there between. In another variant, the surfaces forming two "V"s are disposed with their openings facing each other. In this case, they surround the deflection path in their center. In addition to obtain the desired function that—except for the area of the selection aperture—only line focuses are generated, the above-mentioned deflection elements are advantageous in that they are easy to produce since the surfaces are formed through rotation of straight lines about an axis. These surfaces can be easily produced through rotation about the axis of the truncated cones using automatic turning lathes, circular grinders and similar means by a straight tool advance, and the work result can be easily examined through measuring sensors or optical surface detection. The corresponding applies for external electrodes which form surfaces that limit an imaginary truncated cone from the outside and are correspondingly processed from the inside by a tool, e.g. as clamped cup shape from which the respective electrode is cut out after termination of the lathe work and possibly grinding work.

The monochromator is preferably structured to be symmetrical about a plane, wherein the symmetry plane corresponds to the plane of the selection aperture. A mirror image like arrangement of the deflection elements also results in that identical forces act on the charged particles downstream of the selection aperture and upstream of the selection aperture, only in opposite directions. In this fashion, the dispersion of the charged particles of the selected beam is again completely eliminated after producing the dispersion through the one or several first deflection element(s).

As mentioned above, the monochromator can have a plurality of shapes with respect to its optical axis. The embodiments of the drawing show corresponding examples. It may substantially have the shape of a loop, wherein in this embodiment, the axes must not merge into each other when the loop is closed, since the path of the particles is otherwise no longer clearly determined. For this reason, it must either be an open loop or a loop with lateral offset between the input and the output axes, or the input and output axes must cross. It would, of course, also be feasible that merging is prevented in that the optical axis does not remain exactly in the x plane (in contrast to the above-mentioned symmetry plane in which the optical axis should lie).

One monochromator is, however, particularly useful, in which the optical axis at the output of the monochromator corresponds to the optical axis at the entry of the monochromator, which is in general the extension of the optical axis of the radiation source. This can be obtained when the optical axis of the monochromator has substantially the shape of a Ω, wherein the arc elements of the Ω may be designed both as strong arcs and also as short and flat arcs. The Ω shape is thereby formed by two arc-shaped deflection elements upstream of the selection aperture and two arc-shaped deflection elements downstream of the selection aperture. The circular arc shaped deflection paths of the deflection elements thereby comprise an arc angle of between 120° and 150° as already stated in the above table.

One particular advantage of this Ω shape is that the input and the output deflection element can be provided with a beam passage, such that when the monochromator is switched off, the charged particles can pass the beam passages in a straight line and thereby also move along the optical axis at the output of the monochromator. In this fashion, imaging with or without monochromator is possible. It is thereby particularly useful when the virtual input crossover and the virtual output crossover of the monochromator coincide in its symmetry plane. This maintains the optical path even when the monochromator is switched off. In this fashion, it may be switched on and off without requiring new adjustment of the optical path.

In a further development, the electrodes are externally shielded by plates at zero potential which are oriented parallel to the optical axis. Moreover, shielding plates at extractor potential can be mounted perpendicularly to the optical axis on both sides of the deflection elements, i.e. at the input and output, which contain a small bore as passage openings for the beam passage. The deflecting field is thereby limited in a defined manner and is independent of further potential-carrying parts in the surroundings of the structure. This improves the ability to control and calculate the fringe fields of the toroidal deflection elements. The electrodes may also comprise box-shaped shieldings at extractor potential with passage openings for the charged particle current.

A further subject matter of the invention concerns a radiation source with a monochromator of the above-mentioned type, wherein a radiation source designed as an extractor, with electrostatic lens and circular aperture is disposed upstream of the monochromator for regulating and limiting the particle current, wherein the lens forms a virtual image of the beam source, since it is behind the entry of the monochromator. This improves the charged particle yield supplied to the monochromator.

The invention is explained below with reference to the drawings.

DESCRIPTION OF THE PREFERRED EMBODIMENT

Figure 1:
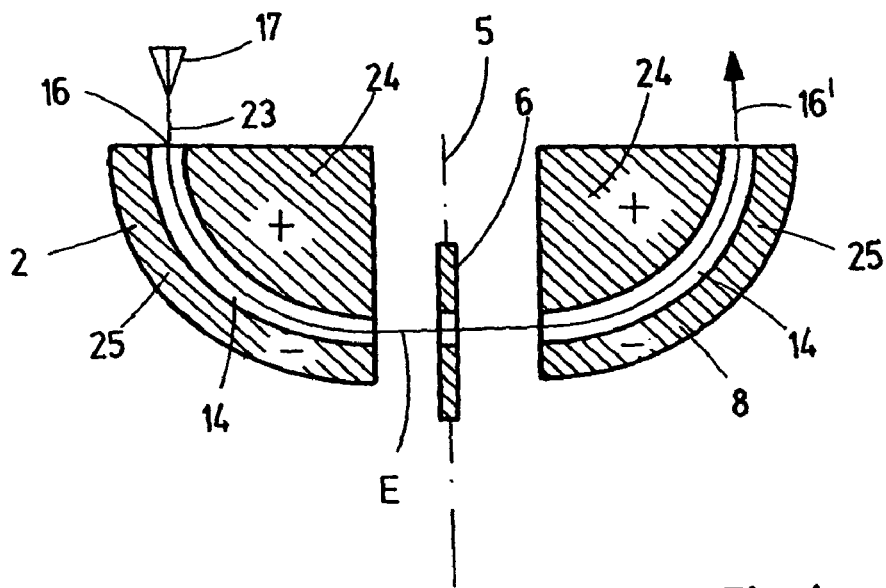
FIG. 1 shows a schematic diagram of an embodiment of the invention having a simple construction.

FIG. 1 shows a schematic diagram of an embodiment of a monochromator 1 having a simple construction in accordance with the invention. The particle current 23 of a radiation source 17 is thereby incident on the entry 16 of the monochromator 1 and is deflected by the deflecting field 2' of a first deflection element 2 for generating a dispersion 4 (see below). This deflection is caused by an inner electrode 24 and an outer electrode 25 which delimit an arc-shaped deflection path 14. When the particle current 23 consists of electrons or negatively charged ions, the inner electrode 24 is positively charged and the outer electrode 25 is negatively charged. When the particle current 23 along the optical axis E of the monochromator 1, when deflected, is dispersely incident on the selection aperture 6 disposed in the plane 5, only the desired energy interval 7 is allowed to pass at that point, which is explained in more detail below. In order to eliminate again the dispersion 4, a further deflection element 8 is provided whose deflecting field 8' reunites the dispersed beams, thereby providing a particle current of higher monochromatism at the output 16' of the monochromator 1.

Functionally identical components or curves have the same reference numerals in all illustrations.

Figure 2:
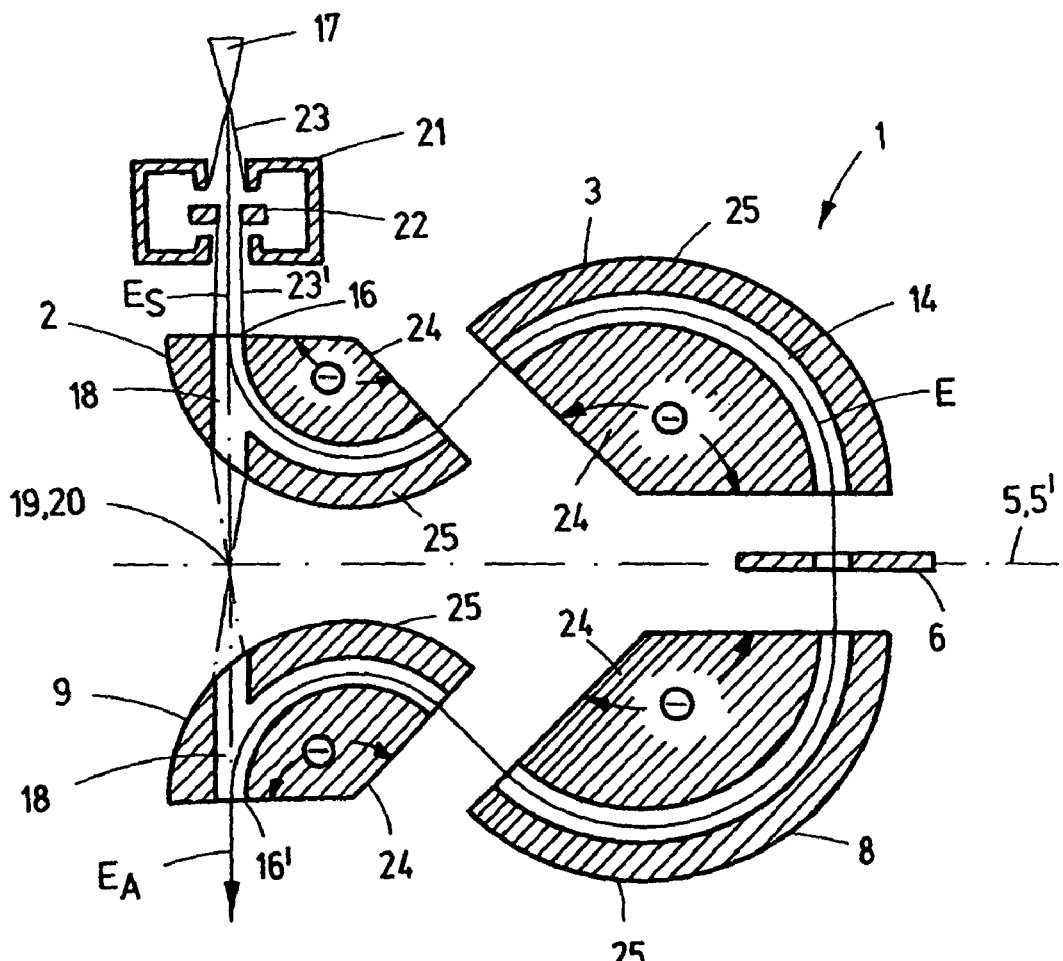
FIG. 2 shows a preferred embodiment.

FIG. 2 shows a preferred embodiment of the invention, showing a monochromator 1 and also a radiation source 17, which is provided for regulating and limiting the particle current 23 with an electrostatic lens 21 and an aperture 22. The radiation source 17 is a ZrO/W Schottky emitter with tungsten filament heating, suppressor, and an anode designed as a circular aperture, the extractor. The potential of the extractor is generally the zero potential (axial potential), which is herein described for the monochromator.

The particle current 23' regulated and limited by the lens 21 and the aperture 22 is incident on the entry 16 of the monochromator 1. This monochromator 1 has four deflection elements, wherein two deflection elements 2, 3 are disposed upstream of the selection aperture 6 and two further deflection elements 8, 9 are disposed downstream of the selection aperture 6. This monochromator 1 is thereby structured such that the optical axis E describes the shape of a Ω. The arc-shaped paths describe arcs in a range between 120° and 150°, since the deflection elements 2, 3, 8, 9 have corresponding angles θ. The plane 5 of the selection aperture 6 is thereby the symmetry plane 5' of the monochromator 1.

In order to obtain another imaging when the monochromator 1 is switched off, the monochromator 1 is designed such that the optical axis $E_S$ extends at the entry 16 of the monochromator 1 exactly in the same direction as the optical axis $E_A$ at the output 16' of the monochromator 1. The deflection element 2 and the deflection element 8 are provided with beam passages 18 along this connecting line, such that after switching off the monochromator 1, the beam is passed on directly from the entry 16 to the exit 16', thereby bypassing the monochromator 1.

Advantageously, the optical path is suitably designed in such a fashion that the virtual input crossover 19 and the virtual output crossover 20 of the monochromator 1 coincide in its symmetry plane 5'. In this fashion, one obtains the same optical focusing, irrespective of whether the monochromator 1 is switched on or off. The only difference is of course that when the monochromator 1 is switched off, the monochromatism, which is achieved, is not the same. With this design, the image is completely maintained when the monochromator 1 is switched off, and remains at the same location only with reduced resolution, since the monochromator 1 function is omitted.

Figure 3:
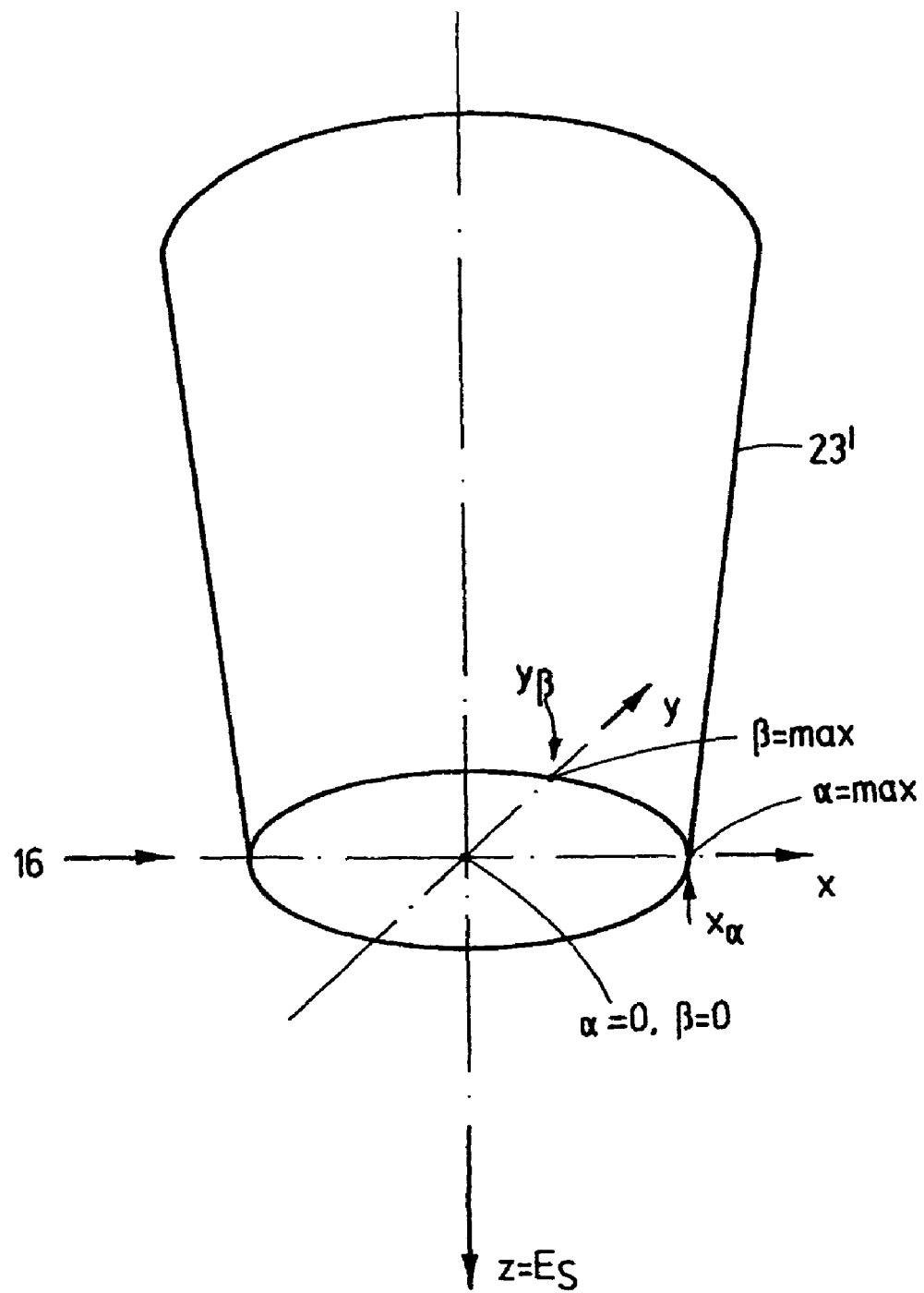
FIG. 3 shows a charged particle beam at the entrance of the monochromator.

FIG. 3 shows a charged particle beam 23' at the entry 16 of the monochromator 1. This illustration explains the numerals used in the following illustrations, and the basic context. The particle current 23' consists of a plurality of charged particles at the entry 16 of the monochromator 1, which do not exactly follow the optical axis $E_S$ at the entry 16 of the monochromator 1, but differ therefrom. This optical axis $E_S$ generally corresponds to the optical axis of the radiation source 17. The charged particles emitted by this radiation source 17 show, in addition to the theoretical possibility of an exact curve in the axis $E_S$, certain angular deviations from the axis $E_S$. These angular deviations are expressed in an x, y, z coordinate system, wherein z corresponds to the curve of the optical axis $E_S$. The angular deviations are stated as angle α or angle β. These are the angles at which the charged particles virtually enter the image of the source (crossover 19 in FIG. 2). Instead of the angles, the coordinates x and y are thereby detected at the entry 16 of the monochromator 1 and the following representations show the deflections A of the charged particles xα and yβ with respect to the optical axis E of the monochromator 1. The charged particles thereby move within a curved orthogonal coordinate system corresponding to the structure of the monochromator 1, e.g. in Ω form, wherein the axis of the system coincides with the path of a reference charged particle of the desired energy and the angles α=0 and β=0. E' is then the respective location on the optical axis E which corresponds to the abscissa in FIGS. 4b, 5b, and 6b. The ordinate shows the deflection of the charged particles from the optical axis E. A particle, which is located exactly on the optical axis E, with an angle α of 0 and an angle β of 0, would exactly travel along its optical axis E of the monochromator 1. All other charged particles move on paths with different deflections A from the optical axis E in dependence on the respective location E' on the optical axis E. Since not all charged particles can be illustrated, two of them are taken as examples for the illustrations of FIGS. 4b, 5b and 6b, the charged particle xα with the maximum angle α which is located on the x-axis at the edge of the particle current 23'. Its deflection β is 0. The path of the particle yβ is correspondingly shown, which has an angle α of 0 for a maximum angle β.

Figure 4A:
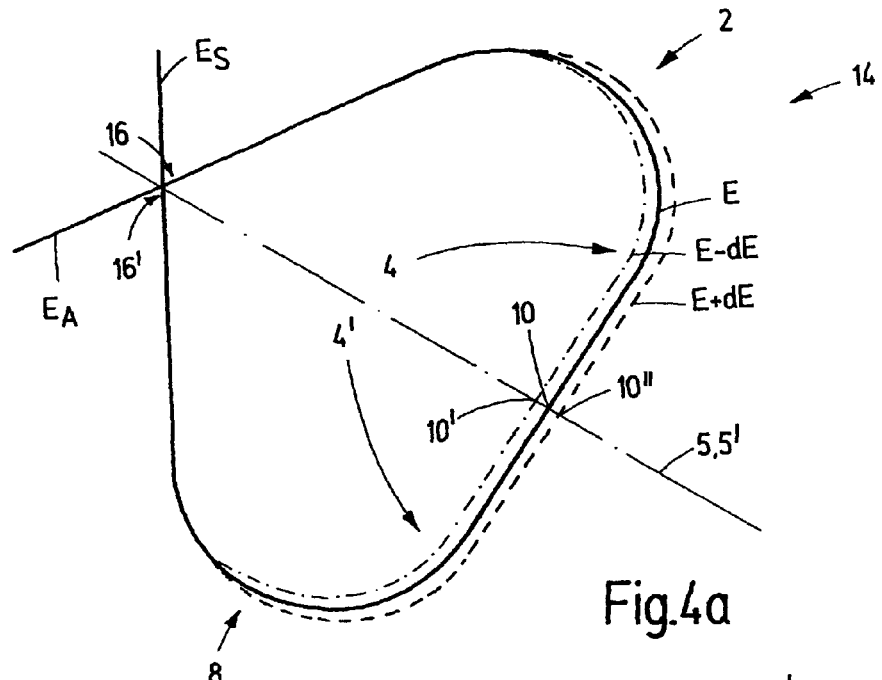
FIG. 4a shows an example of a curve of the deflection path of a monochromator.

FIG. 4a shows an example of a curve of a deflection path 14 of a monochromator 1 which has a loop-shaped deflection path 14. Monochromators 1 have arc-shaped deflection paths 14 in order to separate the charged particles of different energies. With such arc-shaped deflection paths 14, the faster charged particles with higher energy are propagated to the outside and have an axial deviation proportional to the energy deviation dE from the axis E as shown with dashed line E+dE for the strongest deviation. The reverse applies with charged particles of little energy. They follow the dash-dotted line E−dE. The axial deviation is proportional to the energy difference from the desired energy. If intermediate images are generated as point focusings in the area of such a dispersion 4, these expand in correspondence with dispersion, such that point focusing 10 also forms a line which extends from the point focus 10' of the lowest energy to the point focus 10" of the highest energy. The monochromator 1 utilizes this fact in order to permit passage of only one desired energy interval 7. This is explained in more detail with reference to FIG. 7, wherein FIG. 8 shows the line focus described above with reference to prior art, when it occurs simultaneously with a dispersion 4.

In FIG. 4a only two deflection elements 2 and 8 are used, wherein the selection aperture 6 is located in the intermediate symmetry plane 5' of the monochromator 1. The plane 5 of the selection aperture 6 is thereby identical with the symmetry plane 5'.

Figure 4B:
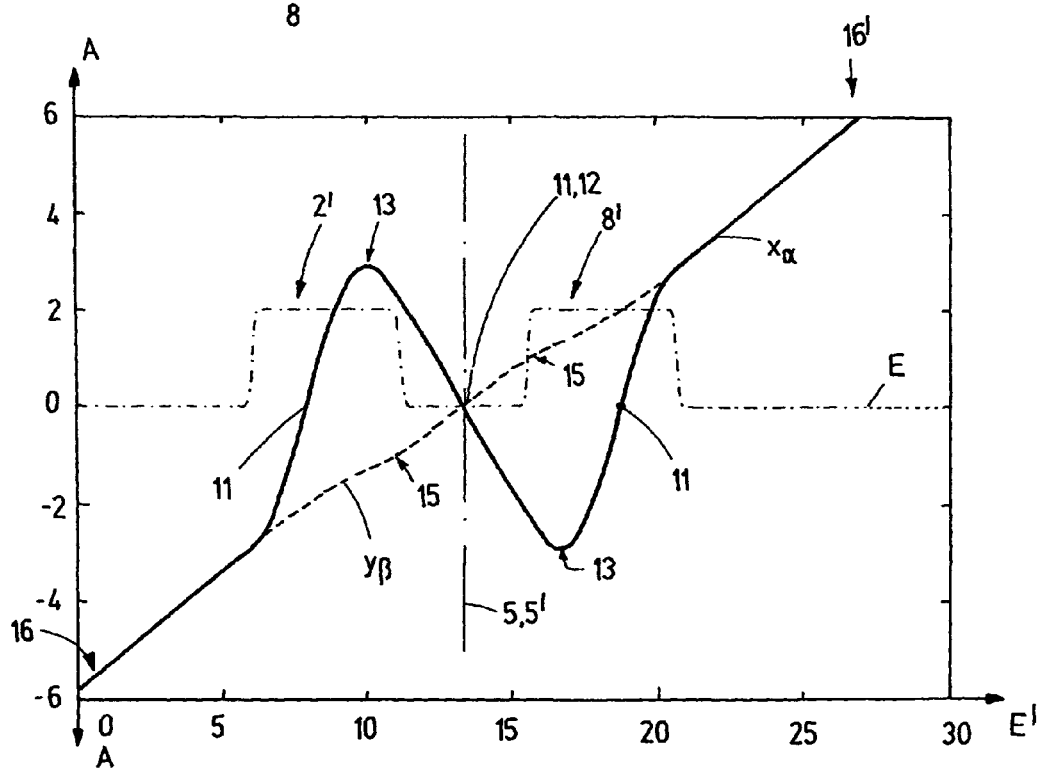
FIG. 4b shows the deflecting fields and the deflections of the charged particles $x_{60}$ and $y_\beta$ with respect to the axis.

In contrast to the curve of dispersion 4 and its compensation 4', FIG. 4b shows the deflection A of the charged particles xα and yα with respect to the optical axis E, wherein the ordinate shows the deflection A in the x direction of the space coordinate system for the charged particles $x_\alpha$, and the deflection A in the y direction for the charged particles $y_\beta$. On the abscissa, the respective location E' is plotted on the optical axis E between the entry 16 of the monochromator 1 and its exit 16'. Imagine that the dispersion 4 of FIG. 4a and the different deflections A of the particles $x_\alpha$, $y_\beta$ are superimposed (for all angles $\alpha$ and $\beta$ between a maximum and a minimum) as shown in FIG. 4b.

The illustration initially shows the deflecting fields 2' and 8' that correspond to the deflection elements 2 and 8 of FIG. 4a. Since these deflecting fields 2' and 8' have asymmetrical fields 2', 8' in the x and y directions with respect to the optical axis E, in the present case only the strength of the dipole component $\Phi_1$ is shown, the $x_\alpha$ particles are deflected in a considerably different fashion than the $y_\beta$ particles. The $x_\alpha$ particles are guided through the first deflecting field 2' through a zero-crossing 11 to generate a line focus or a linear image of the radiation source 17 at that location. The curve of these particles $x_\alpha$ then extends through a reversal point 13 in such a fashion that a further zero-crossing 11 occurs exactly in the plane 5 of the selection aperture 6. In contrast thereto, the $y_\beta$ particles are only minimally influenced by the deflecting field 2', such that only the path curvature is thereby changed 15. Since the $y_\beta$ particles are guided through the deflecting field 2' in such a fashion that they also have a zero-crossing 12 in the plane 5 of the selection aperture 6, a point focus is produced in this plane 5 of the selection aperture 6 without producing a further point focus at another location of the monochromator 1. This point focus is, however, a line due to a dispersion 4 as mentioned above, such that the desired energy interval 7 can be selected (see FIG. 7). The deflecting field 8' subsequently acts exactly oppositely, such that the particles $y_\beta$ and $x_\alpha$ exit the monochromator 1 again opposite to the entry 16 of the monochromator 1 at the same path height and slope in their respective section. The dispersion 4 is thereby additionally eliminated 4' which is also shown in FIG. 4a in that the curves for E−dE, E and E+dE are reunited upstream of the exit 16' of the monochromator 1.

Figure 5A:
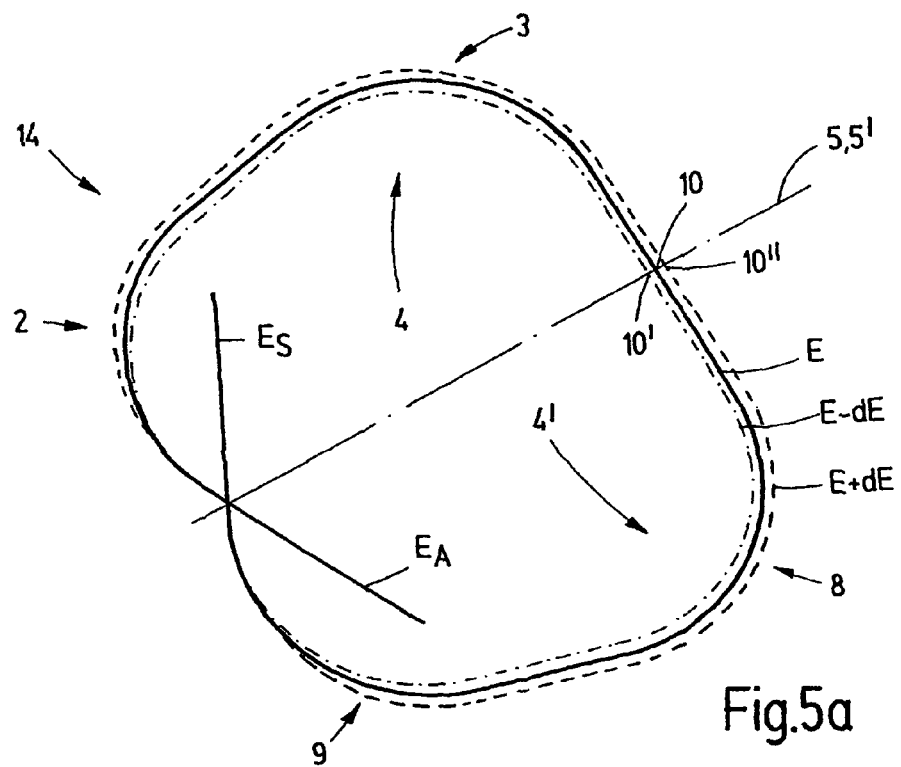
FIGS. 5a, 5b show a further example.
Figure 5B:
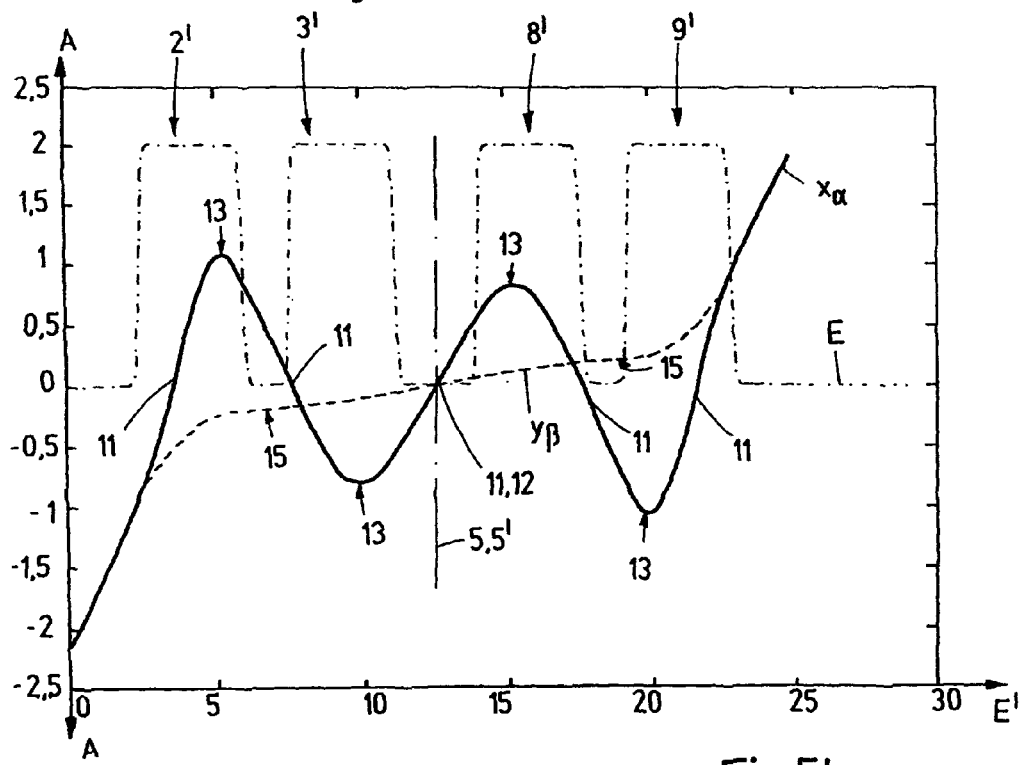

FIGS. 5a and 5b show a further example that corresponds to the one just described, with the difference, that the loop of the deflection path 14 consists of four deflection elements 2, 3, 8, 9 of FIG. 5a.

FIG. 5b correspondingly shows a curve of the parts $x_\alpha$ and $y_\beta$ caused by four deflecting fields 2', 3', 8' and 9' in contrast to the above-mentioned case, wherein these deflecting fields 2', 3', 8', 9' correspond to the four deflection elements 2, 3, 8, 9. Otherwise the above-described applies in a corresponding manner.

Figure 6A:
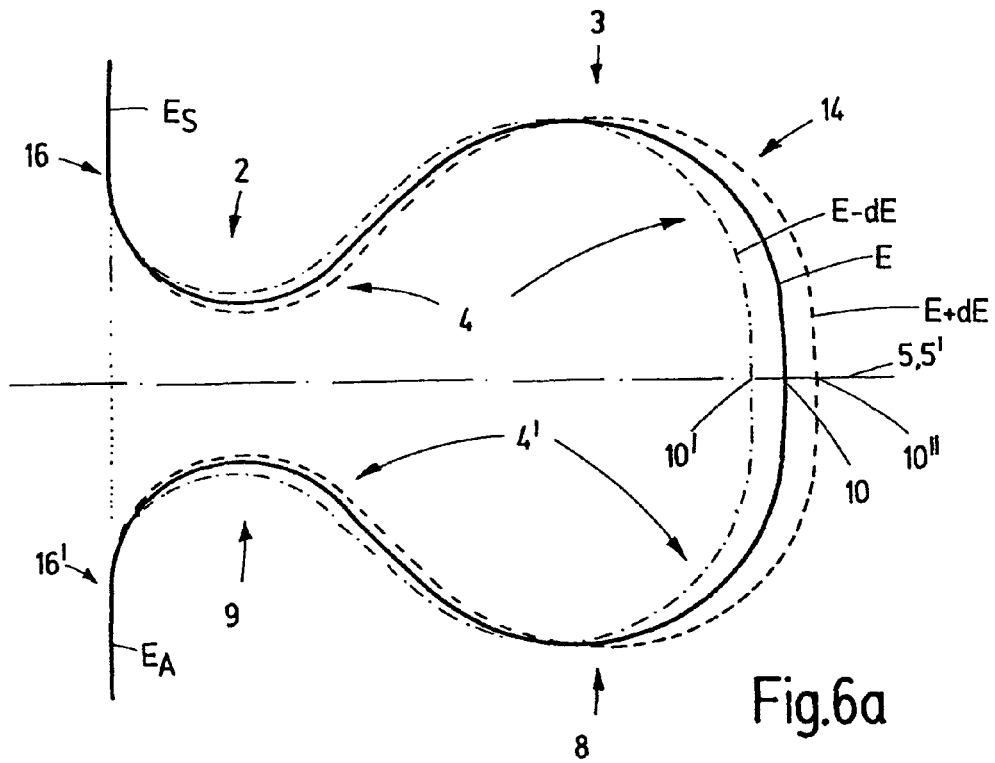
FIGS. 6a, 6b show the same for the embodiment of FIG. 2.
Figure 6B:
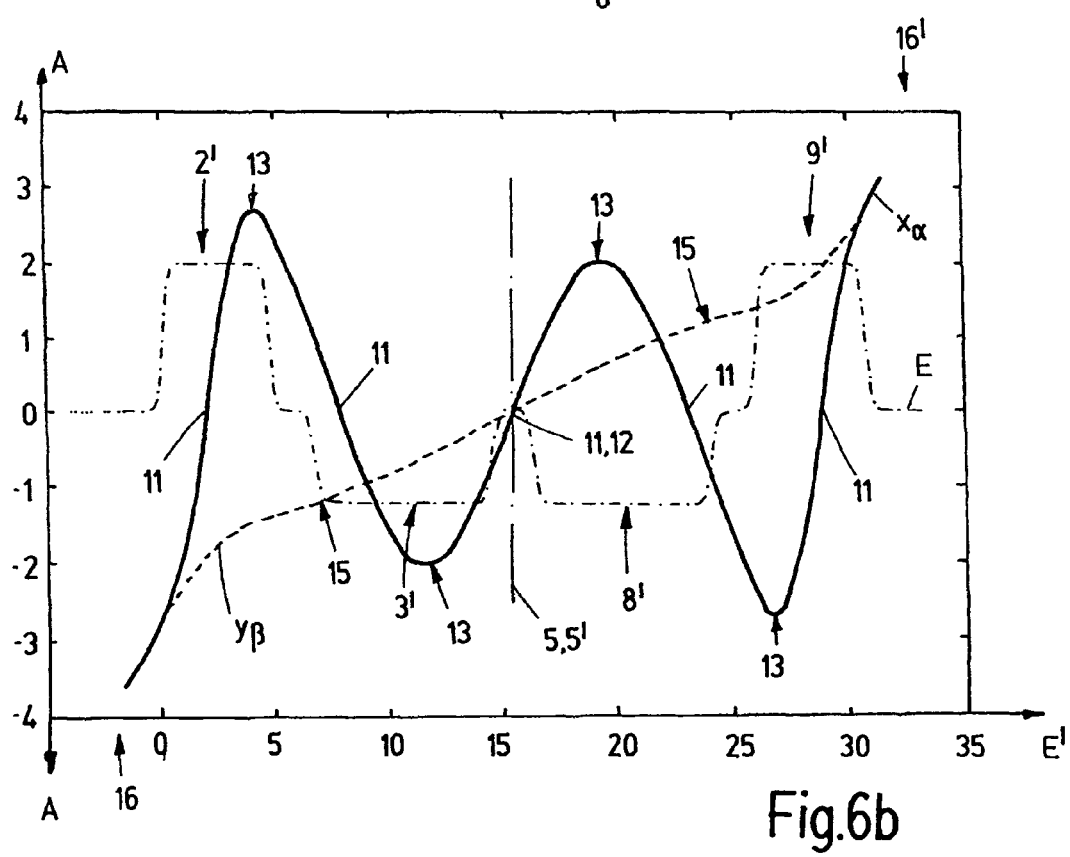

FIGS. 6a and 6b show the curve of the deflection path 14, the deflecting fields 2', 3', 8', 9' and the deflections A for a monochromator 1 whose deflection path 14 has the shape of an $\Omega$. The principles apply as described above with the difference that the deflection elements 2 and 3 have oppositely acting deflecting fields 2' and 3', such that the dispersion 4 of different energies merges in the meantime in this path area as shown in FIG. 6a. However, a dispersion 4 occurs in the plane 5, as described above, which also results in point focuses 10, 10' and 10" of different energies, whereby a desired energy interval 7 can be selected. Also in this case, the deflection elements 8 and 9 and their deflecting fields 8' and 9' ensure that the dispersion 4 is eliminated, as 4' shows in FIG. 6a in that the curves for E−dE and E+dE are again united with the curve E at the exit 16' of the monochromator 1.

FIG. 6b also shows these differently directed deflecting fields 2', 3', 8' and 9' and the curve of the deflections A of the charged particles $x_\alpha$ and $y_\beta$ resulting from the effects of these fields. Also in this case, both charged particles $x_\alpha$ and $y_\beta$ have their zero-crossings 11 and 12 in the plane 5 of the selection aperture 6. Point focuses 10, 10', 10" also occur only at this location. For clarification, it is pointed out again that in this and in the above illustrations, the particles $x_\alpha$ and $y_\beta$ are only examples, since they represent the two extremes $\alpha$=max. and $\beta$=0 or $\beta$=max. and $\alpha$=0. All other particles move in a region between these two extremes. Thus, when the zero-crossings 11 and 12 meet, all charged particles are point focused, and line focused for the other zero-crossings 11, and round cross-sections of the charged particle current are obtained where the lines of $x_\alpha$ and $y_\beta$ cross. Elliptical cross-sections are formed in between, whose longitudinal axes are alternately oriented in the x and y directions. The only point focus 11, 12 of the particles $x_\alpha$, $y_\beta$ in the selection aperture 6 are point focuses 10, 10', 10" (FIGS. 4a, 5a, 6a, 7 and 7a) for different energies of the charged particles, wherein the point focuses 10' and 10" naturally show only the limits for the focuses of all intermediate energy ranges for the smallest and largest energy, which are all present.

Figure 7:
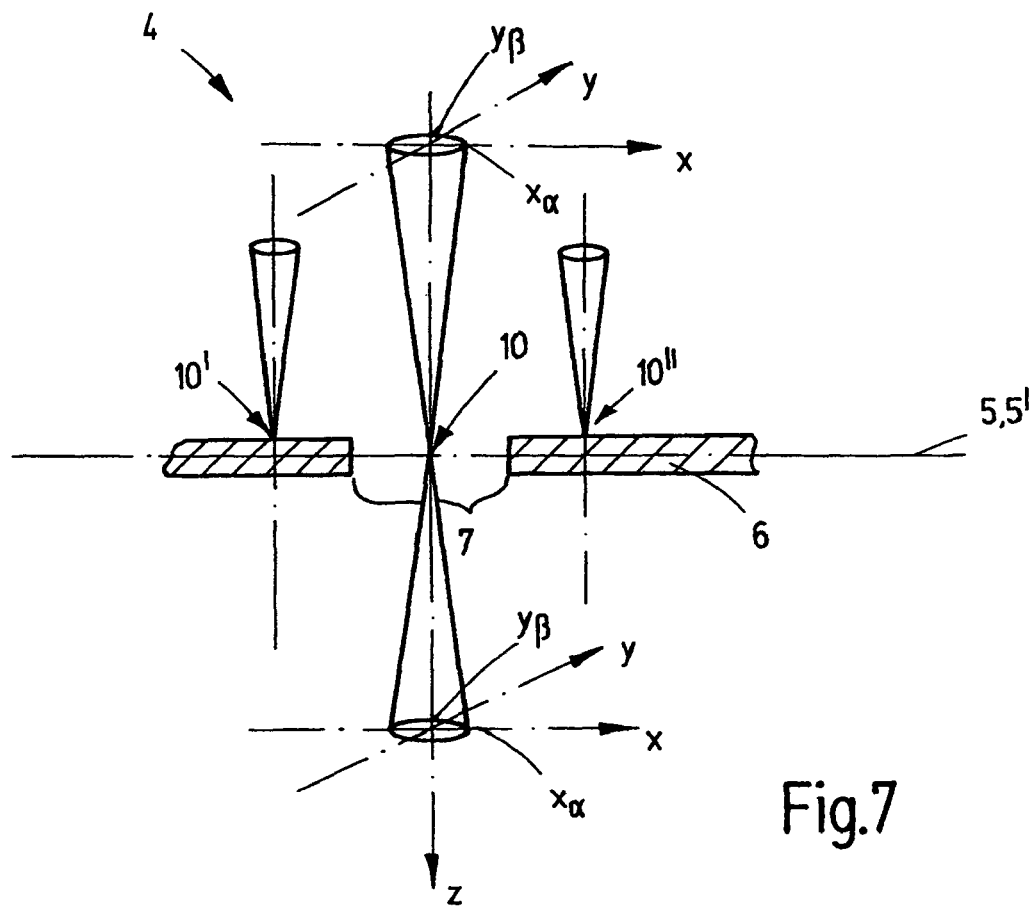
FIG. 7 shows a section through the selection aperture with exemplary focuses of different energy intervals
Figure 7A:
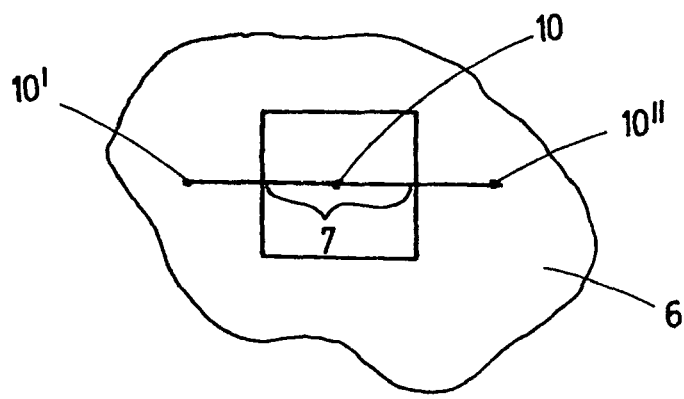
FIG. 7a shows a plan view of the selection aperture.
Figure 8:
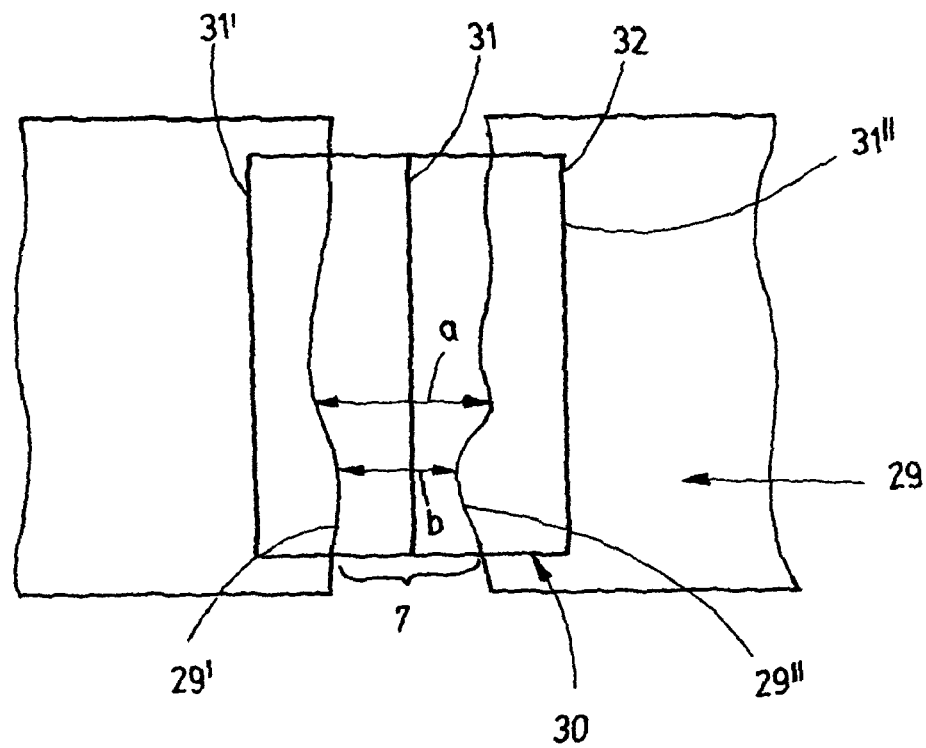
FIG. 8 shows a slit aperture of prior art.

In a corresponding fashion, FIG. 7 shows a section through the selection aperture 6 with these exemplary focuses 10, 10', 10", wherein energies are naturally incident on the selection aperture 6 between 10' and 10" and only the desired energy interval 7 is allowed to pass. The two cones, with the tips in the point focus 10, thereby show as an example the merging of all particles of the exact energy that corresponds to the axial curve E (due to the above-explained curve of the particle current, all illustrated cones have elliptical cross-sections). The illustration must naturally be supplemented such that a line that extends from the point focus 10' to the point focus 10" is filled with such point focuses of different energies. This is shown in detail in FIG. 7a, which shows that the aperture 6 permits passage only of the desired energy interval 7. The aperture opening of the aperture 6 may thereby naturally have any shape, only the line between 10' and 10" must be clearly limited to the energy interval 7 even when the exact position of the particle current possibly shows certain deviations. For this reason, a rectangular aperture opening is useful.

FIG. 8 shows a slit aperture 29 of the above-mentioned prior art in order to clarify the differences. Since no point focuses 10, 10', 10" are thereby produced but line focuses 31, 31', 31", which one can imagine all as lines extending in parallel between the line focus 31' of the smallest energy and the line focus 31" of the strongest energy, in this case it is required that the desired energy interval 7 is selected by a slit aperture 29. For this reason, the above-mentioned problem is that such a slit aperture 29 must have exact lateral limits 29', 29".

Figures 8A, 8B:
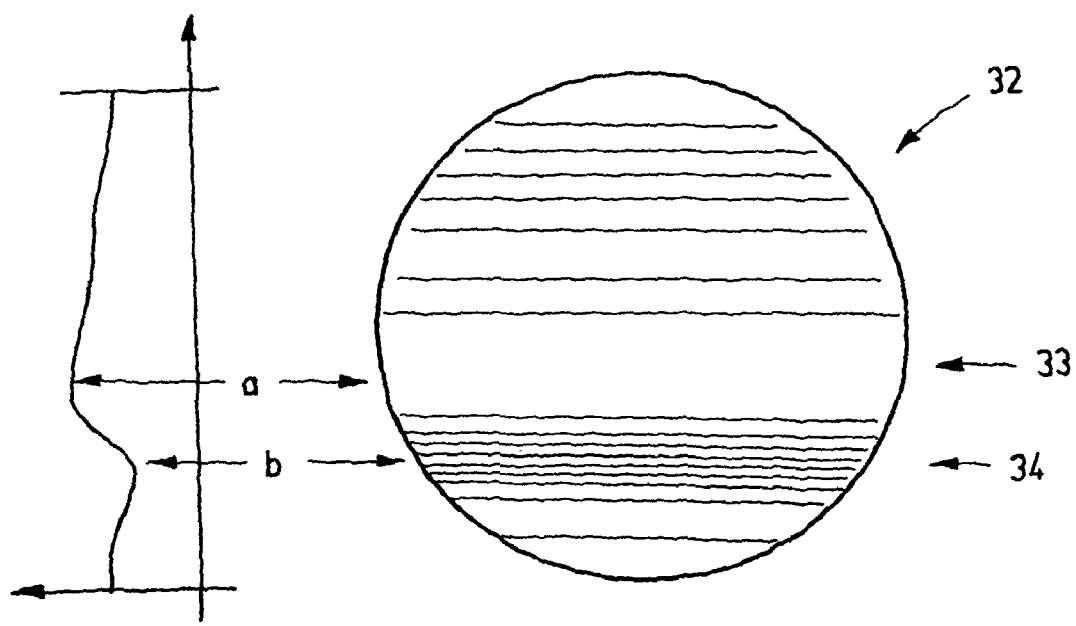
FIG. 8a shows the intensity distribution of the current density across the image and FIG. 8b shows the striped intensity modulations in the image when a slit aperture is used.

Faulty lateral edges 29', 29" are shown in FIG. 8 in an exaggerated wrong fashion in the form of a widening a and a narrowing b, wherein dirt particles would naturally have the same effect. These different widths a and b of the slit aperture 29 distribute the intensity of the current density across the image, as shown in FIG. 8a. In correlation to this intensity distribution, image 8b next thereto shows the intensity differences corresponding to the current density, which are indicated by lines, which represent a bright image area 33 and a dark image area 34. Such images 32 caused by faults or dirty slit apertures 29 of prior art can then result in that images with weak intensity being covered by these intensity modulations such that an evaluation is no longer possible.

Figure 9:
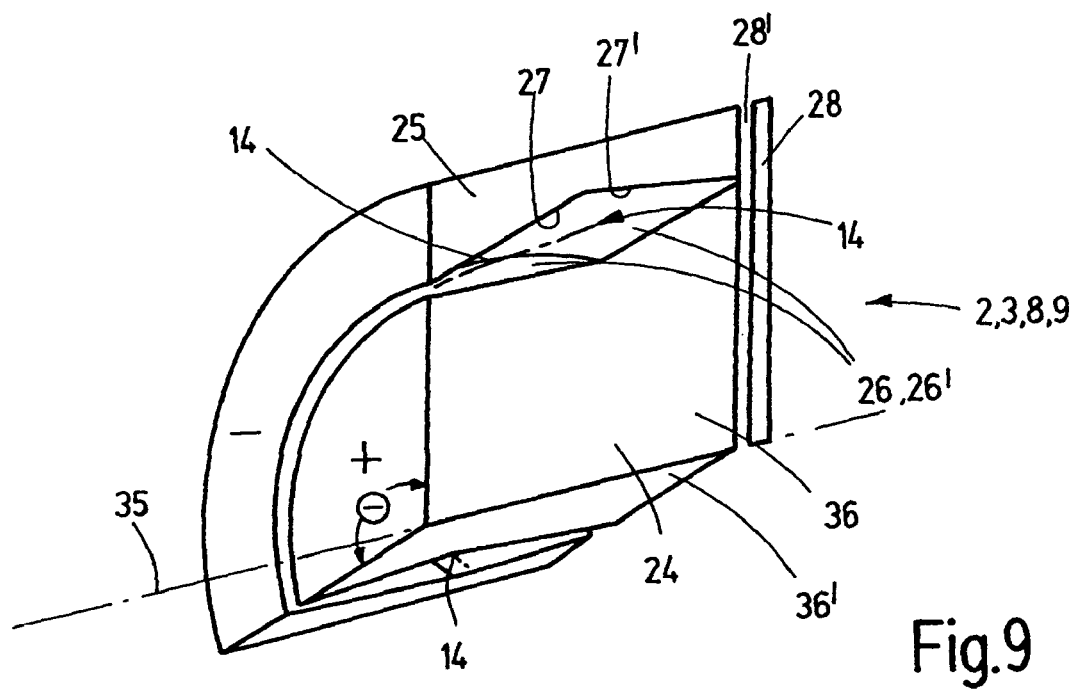
FIG. 9 shows an embodiment of a deflection element of the invention.

FIG. 9 shows an embodiment of a deflection element 2, 3, 8 or 9 of the invention, which consists of an inner electrode 24 and an outer electrode 25. The inner electrode 24 has truncated conical surfaces 26, 26' that have a V-shaped design, wherein this "V" is contrasted with another "V" which is formed by the truncated conical surfaces 27, 27' of the outer electrode 25. In this fashion, a rhombic circular ring space (toroid—for calculation according to the SCOFF approximation) is formed which extends over the entire angular range of the arc angle θ of the respective deflection element 2, 3, 8, or 9. The deflection path 14 extends centrally to the surfaces 26, 26', 27, 27', which thereby comprises the arc shown with dash-dotted lines. In this fashion, the arcs are formed which are, shown above in FIGS. 1, 2, 4a, 5a, and 6a. There is naturally also a small gap at the edge of the electrodes 24, 25, since they are finally at different electric potentials, as is indicated by plus and minus. These gaps are again covered with a gap 28' through plates 28 at zero potential. The front plate is thereby omitted to show the curve of the gap between the electrodes 24 and 25. The axis 35 also shows the position of the axis of rotation through which these electrodes can be produced on an automatic turning lathe or a similar machine tool. The shielding plates are not shown, which are disposed with a gap with respect to the surfaces 36, 36' of the deflection elements 2, 3, 8, 9, which are oriented perpendicularly to the axis E, i.e. to the deflection path 14. These shielding plates each have small bores in the area of the deflection path 14 as passage openings for the charged particle current and are also at extractor potential. With the above-mentioned plates, these shielding plates can form box-shaped shieldings of the deflection elements 2, 3, 8, 9.

Figure 9A:
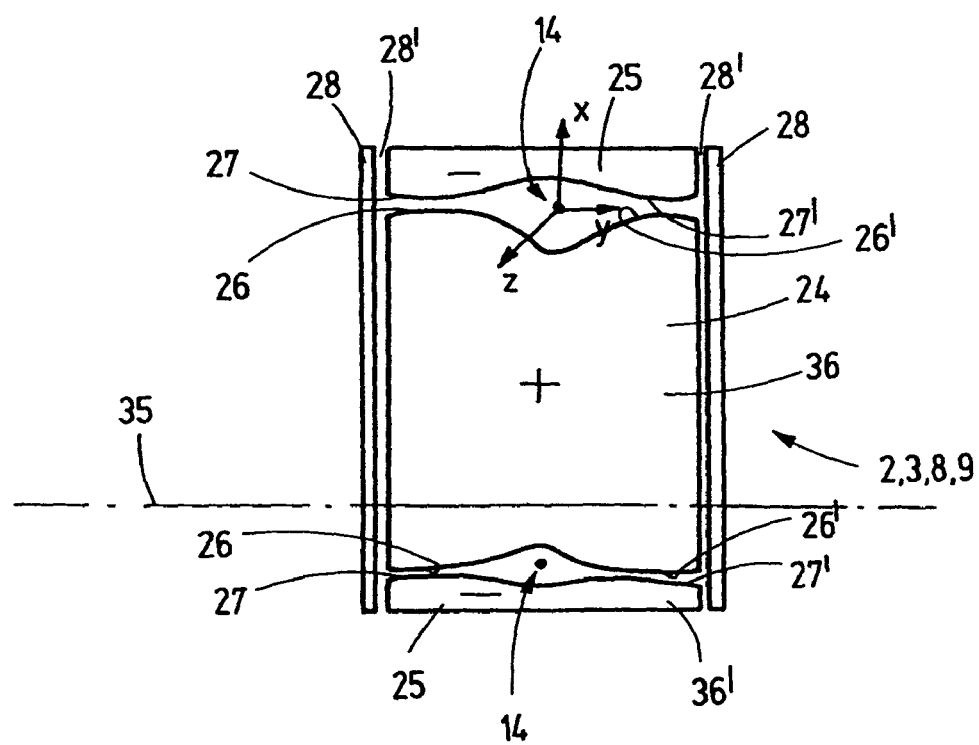
FIG. 9a shows a further embodiment.

FIG. 9a shows a further embodiment of a deflection element 2, 3, 8 or 9, as viewed perpendicularly onto the surface 36, which is also shown in FIG. 9. In contrast to the above-described embodiment, the surfaces 27, 27' of the outer electrode 25 and the surfaces 26 and 26' of the inner electrode 24 are thereby curved. The x-, y- and z-axes of the curved space coordinate system are plotted, wherein the z-axis emerges perpendicularly from the image plane and follows the curve of the deflection path 14. The curved surfaces 26, 26', 27, 27' are symmetrical with respect to the x plane and always have the same separations and curvatures along the z-axis. The contour on the surface 36' is deformed with respect to the surface 36, since the surface 36 is viewed from a perpendicular direction and the surface 36' extends in an inclined rearward direction.

Figure 10A:
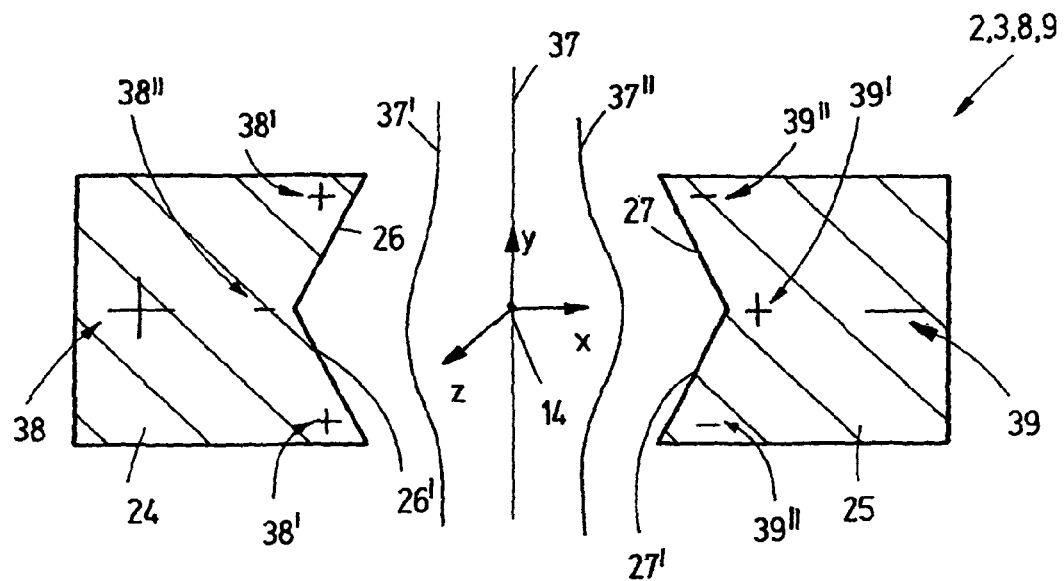
FIG. 10a shows a schematic diagram of the cross-section of a deflection element with formation of a hexapole.

FIG. 10a shows a schematic diagram of the cross-section of a deflection element 2, 3, 8, 9 with formation of a hexapole. This cross-section thereby corresponds to the cross-section already shown in FIG. 9. The electrodes 24, 25 initially form a dipole for each deflection element 2, 3, 8, 9, which is sufficient to generate the desired deflection path 14. Only the required arcs must be combined with the corresponding arc angles θ. Such a monochromator 1 composed of dipoles would, in turn, generate image aberrations, which can be minimized by using multipole elements. Multipole elements as used herein are not pure multipole elements, although the expert uses this term (see Kahl loc. cit.), but dipoles superposed by a multipole. Deflection elements may thereby be formed as dipoles superimposed by multipoles due to their geometrical shape.

FIG. 10a shows a schematic diagram of one possible geometrical form as one example of a hexapole produced in this fashion. This shape having surfaces 26, 26', 27, 27', which, in section, form two "V"s with facing openings, produce a certain shape of the equipotential lines 37, 37', and 37". The zero potential 37 extends in the x-y plane as a straight line through the electrodes 24, 25 due to symmetry to the curved x-z surface in correspondence with the deflection path 14. In contrast thereto, the equipotential lines 37' and 37" are curved due to potential deviations on the electrodes 24, 25 due to their geometry. The potential 38 of the inner electrode 24 therefore has two positive 38' and one negative 38" deviation, which are arranged symmetrically. This is equally true for the potential 39 of the outer electrode 25 with a positive 39' and two negative 39" deviations. The drawn equipotential lines 37', 37" are thereby equipotential surfaces 37', 37" which are curved in the z direction and determine the curve of the deflection path 14. These equipotential surfaces 37, 37', 37" can be calculated through corresponding calculation of the geometry of the surfaces 26, 26', 27, 27' (see above Kahl loc. cit.) to minimize the image aberrations caused by the monochromator 1. A hexapole can correct image aberrations of second order.

Figure 10B:
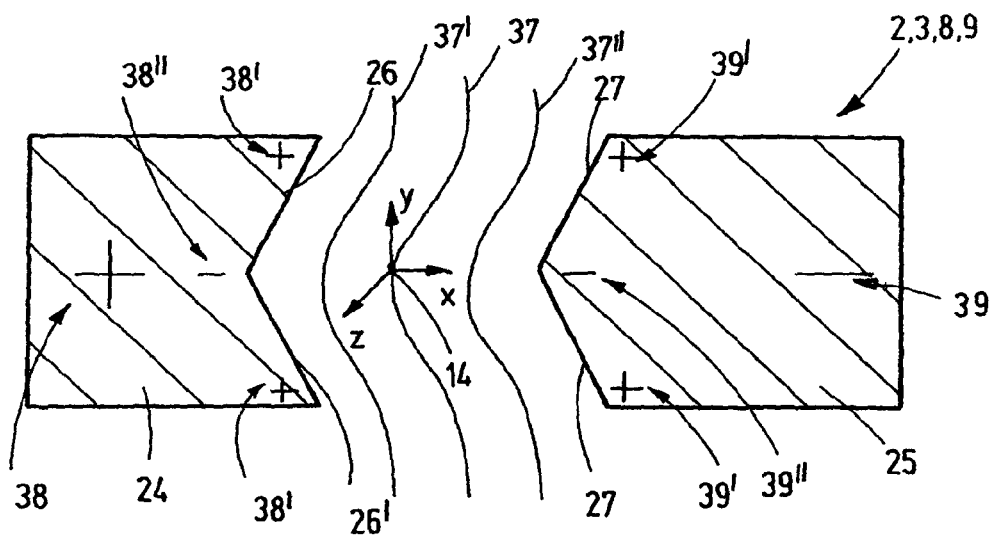
FIG. 10b with formation of a quadrupole.

FIG. 10b shows a different geometrical shape of the surfaces 26, 26', 27, 27' of the electrodes 24, 25. These are not symmetrical with respect to the yz section, wherein the equipotential line 37 of the extractor potential defined as the zero potential extends in a curved fashion and the other equipotential lines (or surfaces) 37', 37" are also correspondingly curved. The geometry, which is shown as an example can form a dipole superposed by a quadrupole. Further variations of the different refractive forces can thereby be produced in the xz and yz sections. Multipole elements of higher order are naturally also possible if aberrations of higher order are to be corrected.

Of course the drawings can only represent a small fraction of the embodiments in which the invention can be realized. The shapes of the deflection path 14 may also have different designs and it is of course also possible to provide more than four deflection elements 2, 3, 8, 9. The shape of the electrodes 24 and 25 may also be designed in most different ways. Instead of the surfaces 26, 26', 27, 27' other most different shapes may also be used. The only important thing is that they differ sufficiently from the point symmetry of a spherical shape in order to prevent point focuses within the deflecting fields 2', 3', 8', 9'.

LIST OF REFERENCE NUMERALS 1 monochromator
2,3 deflection elements
2',3' deflecting fields
4 dispersion
4' elimination of dispersion
5 plane of the selection aperture
5' symmetry plane of the monochromator
6 selection aperture
7 desired energy interval
8,9 deflection elements
8',9' deflecting fields
10 point focus of the desired energy interval
10' point focus (lowest energy)
10" point focus (highest energy)
11 zero-crossings of xα
12 zero-crossings of yβ
13 reversal points
14 deflection path
15 changes of the path curvatures of the charged particles yβ
16 entrance of the monochromator
16' exit of the monochromator
17 radiation source
x,y,z space coordinates, wherein the optical axis E corresponds to the z axis and x and y provide a plane perpendicular thereto, in which the charged particles xα and yβ are deflected
E optical axis of the monochromator
E−dE axial deflection of particles of lowest energy
E+dE axial deflection of particles of highest energy E' location on the optical axis
$E_S$ optical axis at the entry of the monochromator
$E_A$ optical axis at the exit of the monochromator
A deflections of the charged particles with respect to the optical axis
α angle of the path of the charged particles of an x section with respect to the optical axis upon entry into the monochromator
β angle of the path of the charged particles of a y section with respect to the optical axis upon entry into the monochromator
$x_α$ charged particles of a x section with α=max, β=0
$y_β$ charged particles of a y section with β=max, α=0;
θ arc angle of the arc-shaped deflection elements
φ+,φ− potentials of the electrodes of the deflection elements
18 beam passage
19 virtual entrance crossover
20 virtual exit crossover
21 electrostatic lens
22 aperture
23 particle current of the radiation source
23' particle current regulated and limited by the lens and the aperture
24 inner electrode
25 outer electrode
26,26' truncated conical surfaces of the inner electrode (as a section from a truncated conical lateral surface)
27,27' truncated conical surfaces of the outer electrode (as a section from a truncated conical lateral surface)
28 plates at zero potential
28' gap
29 slit aperture of prior art
29',29" lateral limitations of the slit aperture
30 beam with rectangular cross-section
31 line focus of the desired energy
31' line focus (too low energy)
31" line focus (excessive high energy)
32 image of prior art
   a widening of the slit aperture
   b narrowing of the slit aperture
33 bright image area
34 dark image area
35 axis of rotation during production of the electrodes
36,36' surfaces of the deflection elements perpendicular to the axis (E)
37,37',37" equipotential lines (or surfaces)
37 zero potential (extractor potential)
37' positive potential
37" negative potential
38 positive potential of the inner electrode
38' positive deviation
38" negative deviation
39 negative potential of the outer electrode
39' positive deviation
39" negative deviation

I claim:

1. A monochromator for charged particle optics or for electron microscopy, the charged particles emanating from a radiation source disposed upstream of the monochromator, the radiation source having an image into which the charged particles virtually enter at a first angle with respect to an optical axis in a first plane and at a second angle with respect to the optical axis in a second plane, the monochromator comprising:
a selection aperture having a selection aperture plane;
at least one first deflection element disposed upstream of said selection aperture and having first electrodes generating a first electrostatic deflecting field, said first deflecting field producing a dispersion of the charged particles in the selection aperture plane for selecting charge particles of a desired energy interval; and
at least one second deflection element disposed downstream of said selection aperture and having second electrodes generating a second electrostatic deflection field which eliminates the dispersion of said at least one first deflecting field, said first and said second deflection elements having a design other than spherically shaped, wherein potentials applied to said first and said second electrodes cause charged particles which virtually enter the image of the radiation source at respective first angles in the first plane to be differently focused than charged particles which virtually enter the image of the radiation source at respective second angles in the second plane, with charged particles of one energy being point focused exclusively in said selection aperture plane, wherein zero-crossings of deflections of the charged particles in the first and the second planes only coincide at a same axial position at said selection aperture plane.

2. The monochromator of claim 1, wherein said first and said second deflecting fields are designed in such a fashion that there are no further focuses in the monochromator except for the zero-crossings of the deflections of the charged particles in the first and the second planes at said selection aperture plane.

3. The monochromator of claim 1, wherein said first and said second deflection elements are designed in such a fashion that said first and said second deflecting fields cause reversal points in deflections of the charged particles in an x direction extending within said first plane with intermediate zero-crossings through the optical axis of the deflection path, said first and said second deflecting fields only causing changes of path curvatures having one single zero-crossing through the optical axis in the area of said selection aperture in a y direction extending perpendicularly to the x direction within said second plane.

4. The monochromator of claim 3, wherein said first and said second electrodes are substantially designed as sections of toroids, whose surfaces extend symmetrically to an xz plane in a coordinate system which is orthogonal and curved along a z axis and in which the z axis corresponds to the optical axis of the monochromator, have same separations from the z axis at any location thereon, and have a shape in an xy plane which differs from straight lines, such that dipoles formed by said first and said second electrodes are superposed by multipoles, wherein surfaces of said first and said second electrodes are designed in such a fashion that aperture aberrations caused by the monochromator can be compensated by said multipoles.

5. The monochromator of claim 4, wherein said multipoles are quadrupoles.

6. The monochromator of claim 4, wherein said multipoles are hexapoles.

7. The monochromator of claim 4, wherein said surfaces of said first and said second electrodes are curved.

8. The monochromator of claim 4, wherein said first and said second electrodes have surfaces in a form of a section of a truncated cone.

9. The monochromator of claim 8, wherein said surfaces form two "V"s having tips pointing in a same direction.

10. The monochromator of claim 8, wherein said surfaces form two "V"s having openings facing towards each other.

11. The monochromator of claim 1, wherein the monochromator is symmetrical with respect to said selection aperture plane.

12. The monochromator of claim 1, wherein the optical axis of the monochromator has substantially a shape of a closed loop.

13. The monochromator of claim 12, wherein a virtual input crossover and a virtual output crossover of the monochromator coincide in said selection aperture plane.

14. The monochromator of claim 1, wherein the optical axis at an exit of the monochromator corresponds to an extension of the optical axis at an entry of the monochromator.

15. The monochromator of claim 14, wherein the optical of the monochromator has substantially a shape of an Ω.

16. The monochromator of claim 15, wherein said Ω shape is formed by two deflection segments of said first deflection element and two deflection segments of said second deflection element, wherein said deflection segments have circular arc shaped deflection paths which each have an arc angle between 120° and 150°.

17. The monochromator of claim 14, wherein said first and said second deflection elements define a beam passage in a direction of input and output axes of the monochromator such that, when the monochromator is switched off, the charged particles also move along the optical axis at the output of the monochromator.

18. The monochromator of claim 1, wherein said first and said second electrodes are externally shielded with plates at extractor potential, said plates being oriented parallel to the optical axis.

19. The monochromator of claim 18, wherein said first and said second electrodes have surfaces which are oriented perpendicularly to the optical axis, said first and said second electrodes comprising shielding plates at extractor potential having passage openings for charged particle current.

20. The monochromator of claim 19, wherein said first and said second electrodes have box-shaped shieldings at extractor potential with passage openings for charged particle current.

21. A radiation source for the monochromator of claim 1, the radiation source having an electrostatic lens and an aperture disposed upstream of the monochromator for regulating and limiting a charged particle current, wherein said lens generates a virtual image of the radiation source which is downstream of an entrance of the monochromator.

* * * * *